US00RE39949E

(19) United States
(12) Reissued Patent
Chiok

(10) Patent Number: US RE39,949 E
(45) Date of Reissued Patent: Dec. 25, 2007

(54) SOUND INTERMEDIATE FREQUENCY AMPLIFIER FOR A BROADCAST RECEIVER

(75) Inventor: Huan S. Chiok, Singapore (SG)

(73) Assignee: Thomson Licensing, Boulogne-Billancourt (FR)

(21) Appl. No.: 11/064,521

(22) Filed: May 2, 2005

Related U.S. Patent Documents

Reissue of:
(64) Patent No.: 5,426,394
Issued: Jun. 20, 1995
Appl. No.: 08/029,277
Filed: Mar. 12, 1993

(30) Foreign Application Priority Data

Mar. 25, 1992 (EP) ..... 92400816

(51) Int. Cl.
*H03F 1/26* (2006.01)

(52) U.S. Cl. ..... 330/149; 381/94.5
(58) Field of Classification Search ..... 330/149, 330/297; 381/94.5, 120
See application file for complete search history.

(56) References Cited

U.S. PATENT DOCUMENTS

| | | | | | |
|---|---|---|---|---|---|
| 3,798,559 | A | * | 3/1974 | Tomita | 330/149 |
| 4,481,462 | A | * | 11/1984 | De Kleijn | 330/297 |
| 4,633,188 | A | * | 12/1986 | Matsuta | 330/147 |
| 4,956,616 | A | * | 9/1990 | Botti | 330/297 |

FOREIGN PATENT DOCUMENTS

| | | | |
|---|---|---|---|
| DE | 2854196 | * | 6/1980 |
| DE | 3244254 | * | 3/1984 |
| EP | 0069843 | * | 1/1983 |
| GB | 2096423 | * | 10/1982 |

OTHER PUBLICATIONS

Translation of "AL" Previously Disclosed on Mar. 11, 1993 of Ger.2854196.*
Translation of "AM" Previously Disclosed on Mar. 11, 1993 of EPO 0069843.*
Translation of "AN" Previously Disclosed on Mar. 11, 1993 or Ger.3244254.*
U.S. Appl. No. 07/703,107, filed May 5, 21, 1991, for M. R. Anderson et al.*
RCA/GE Color Television Basic Service Data CTC 169(DV), published by Thomson Consumer Electronics, Inc., Indianapolis, Ind. in 1990, pp. 2–G–1.*

* cited by examiner

*Primary Examiner*—Steven J. Mottola
(74) *Attorney, Agent, or Firm*—Joseph J. Laks; Robert D. Shedd; Reitseng Lin

(57) ABSTRACT

In a broadcast receiver, a dc voltage operating source is coupled to an operating voltage terminal of a sound IF integrated circuit via a collector/emitter path of a transistor, and a second source of operating voltage is connected via an RC integrating network to the base of the transistor, with the base of the transistor being connected to ground via a zener diode.

3 Claims, 1 Drawing Sheet

SOUND INTERMEDIATE FREQUENCY AMPLIFIER FOR A BROADCAST RECEIVER

Matter enclosed in heavy brackets [ ] appears in the original patent but forms no part of this reissue specification; matter printed in italics indicates the additions made by reissue.

FIELD OF THE INVENTION

The invention relates to a sound intermediate frequency amplifier according to the introductory part of claim 1.

BACKGROUND OF THE INVENTION

Within a television receiver during a switching from "OFF" to "ON" or switching from "Stand-by" to "ON" audible disturbance within the reproduced sound occurs, which is generally called "POP". This disturbances in form of a click is due to a sudden change in the operating voltage fed to the sound intermediate frequency amplifier IC. According to prior art capacitors are introduced to prevent such a sudden change in operating voltage. However such known circuits operates not sufficiently so that in most cases an indesirable "POP" remains.

SUMMARY OF THE INVENTION

It is an object of the invention to modify the circuit for the sound intermediate frequency amplifier in such a way that such disturbances in audio reproduction like "POP" do not occur or remain inaudible.

The invention relates to a sound intermediate frequency amplifier for a broadcast receiver including an IC having an operating voltage terminal connected to a source of a dc operating potential. Within such an amplifier the invention consists in that said dc source is connected to said terminal via the collector/emitter-path of a transistor and that a second source of operating potential is connected via a RC integrating network to the base of said transistor, the base being connected to ground via a zener diode. In a preferred embodiment of the invention a resistor is provided between said transistor and said operating voltage terminal of said IC, whereas the operating voltages are derived by rectification of the output pulse voltage of the line fly-back transformer of a television receiver.

The circuit of the invention fulfils two objects simultaneously. On one hand the circuit prevents a sudden change in operating voltage fed to IC and provides a soft or smooth increase in operating voltage during switch on of the receiver. On the other hand the circuit effects an additional stabilization of the operating voltage fed to the sound intermediate frequency amplifier IC by the action of said diode. So very good results are achieved by a rather simple circuit which generally includes only one transistor, one resistor, one capacitor and one zener diode.

BRIEF DESCRIPTION OF THE DRAWING

In order that the invention may be better understood and easily carried out into practice an embodiment of the invention is described in connection with an accompanying drawing. In the drawing

DESCRIPTION OF THE PREFERRED EMBODIMENT

Figure 1:
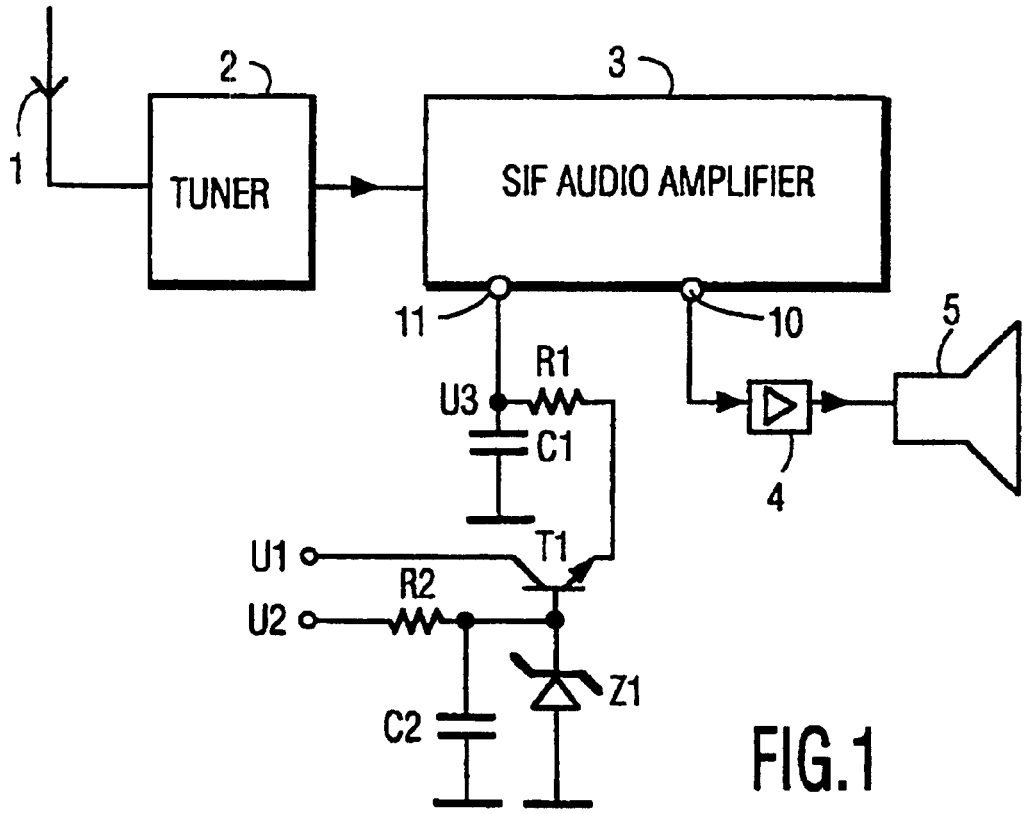
FIG. 1 shows a sound intermediate frequency amplifier together with the circuit according to the invention FIG. 2 waweforms for illustrating the function of the circuit according to FIG. 1.

In FIG. 1 an antenna 1 is connected to a tuner 2 of a television receiver. Output of tuner 2 is connected to a sound intermediate frequency amplifier and audio amplifier IC 3. IC 3 among other terminals has an operating voltage terminal 11 for supplying a dc operating voltage thereto and a terminal 10 providing output audio frequency signal which is fed via an audio amplifier 4 to loudspeaker 5 for sound reproduction.

Operating voltage U1 for IC 3 is supplied via the collector/emitter-path of a transistor T1 and resistor R1 to terminal 11 which is further connected to ground via capacitor C1. A second dc operating voltage U2 is connected via integrating circuit with resistor R2 and capacitor C2 to base of transistor T1, the base being connected to ground via zener diode Z1.

Figure 2:
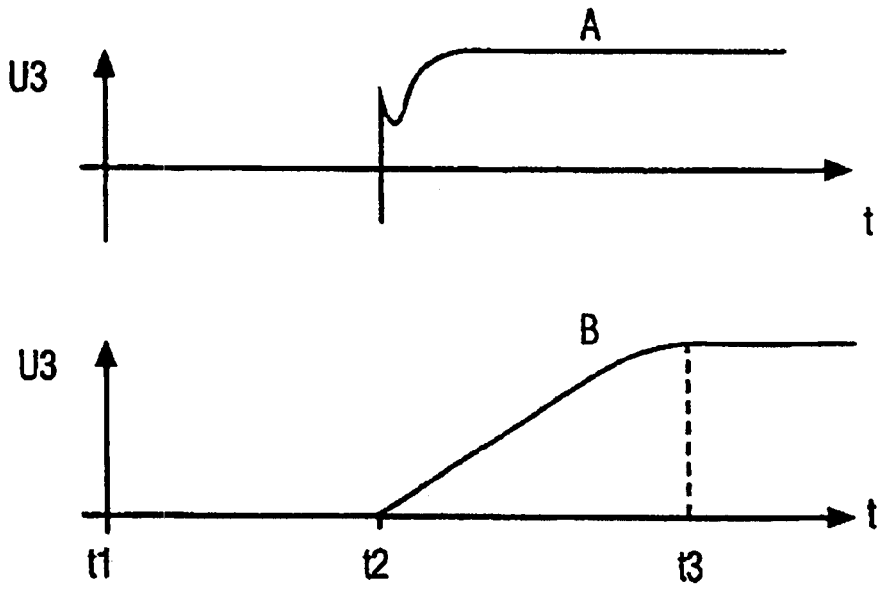

In connection with FIG. 2 the operating of the circuit according to FIG. 1 is explained. From t1 to t2 television receiver is switched off so that voltage U3 at terminal 11 is zero and no output voltage is fed from terminal 10 to amplifier 4. At t2 the television receiver is switched on from "OFF" status of "stand-by" status. Waveform A shows a sudden rise or jump within voltage U3 at terminal 11, said jump generating the indesired POP at loudspeaker 5. In the circuit according to FIG. 1 at t2 capacitor C2 is unloaded so that voltage at base of T1 is zero so that short after t2 T1 is cut off and U3 cannot make the sudden change or jump as in the waveform A. After t2 capacitor C2 is charged via R2 so that the voltage at base of T1 increases in positive direction. T1 becomes conductive so that also U3 increases smoothly according to waveform B. At t3 voltage U3 reaches the final value which is the same at the final value of waveform A. It can be seen that the sudden change or jump of waveform A which is a reason for undesired POP is avoided and undesired POP occurs not at loudspeaker 5.

At t3 voltage at base of T1 reaches the zener voltage of Z1 and cannot further increase. As the voltage at the emitter of T1 always remains closely to the voltage at base of T1 by a difference of the emitter to base voltage of about 0.7 V, voltage at the emitter of T1 and so voltage U3 is stabilized by the action of zener diode Z1. Any variation in U1 therefore are compensated so that the IC 3 is always supplied at terminal 11 with a constant stabilized dc operating potential U3.

In a television receiver dc voltages U1 and U2 may be generated by rectification of the pulse voltage at the line output transformer of the television receiver. Hence, the circuit according to FIG. 1 solves the "POP" sound problem and also helps to stabilize the dc supply voltage for SIF-IC 3.

Within a practical tested circuit according to FIG. 1 the elements shown in FIG. 1 had the following values:

R1: 1,2 Ohm
R2: 2,2 kOhm
CI: 47 mikroF
C2: 470 mikroF
T1: type BC637
Z1: type ZPD13
U1: +13 V
U2: +25 V

I claim:

1. A sound intermediate frequency amplifier for a broadcast receiver comprising;

an integrated circuit having an operating voltage terminal connected to a first source of a dc operating voltage, said operating voltage terminal being connected to ground via a capacitor, said first source of operating voltage is connected to said operating voltage terminal via a collector-emitter path of a transistor, and a second source of operating voltage is connected via a RC integrating network to a base of said transistor, the base being connected to ground via a zener diode.

2. The amplifier according to claim 1, wherein a resistor is provided between said transistor and said operating voltage terminal.

3. The amplifier according to claim 1, wherein said second source of operating voltage is higher than said first source of operating voltage.

* * * * *